(12) United States Patent
Meusel et al.

(10) Patent No.: US 10,985,288 B2
(45) Date of Patent: Apr. 20, 2021

(54) MONOLITHIC MULTIPLE SOLAR CELLS

(71) Applicant: AZUR SPACE Solar Power GMBH, Heilbronn (DE)

(72) Inventors: Matthias Meusel, Heilbronn (DE); Gerhard Strobl, Stuttgart (DE); Frank Dimroth, Gundelfingen (DE); Andreas Bett, Freiburg (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 15/705,306

(22) Filed: Sep. 15, 2017

(65) Prior Publication Data

US 2018/0062018 A1 Mar. 1, 2018

Related U.S. Application Data

(60) Continuation of application No. 14/988,250, filed on Jan. 5, 2016, now Pat. No. 9,799,789, which is a
(Continued)

(30) Foreign Application Priority Data

Jan. 4, 2005 (DE) ...................... 10 2005 000 767.8

(51) Int. Cl.
*H01L 31/0725* (2012.01)
*H01L 31/0216* (2014.01)
(Continued)

(52) U.S. Cl.
CPC .... *H01L 31/0725* (2013.01); *H01L 31/02168* (2013.01); *H01L 31/02327* (2013.01);
(Continued)

(58) Field of Classification Search
CPC ........... H01L 31/0687; H01L 31/06875; H01L 31/054; H01L 31/056; H01L 31/0725;
(Continued)

(56) References Cited

U.S. PATENT DOCUMENTS 5,091,018 A * 2/1992 Fraas ................ H01L 31/02168
136/244
6,618,410 B1 9/2003 Fischer et al.
(Continued)

FOREIGN PATENT DOCUMENTS

JP 2001308354 A * 11/2001
WO WO 2004/017425 A1 2/2004

OTHER PUBLICATIONS

Mathews et al,Mechanically Stacked Solar Cells for Concentrator Photovoltaics, May 2011, RE&PQJm vol. 1, No. 9, pp. 1294-1299 (Year: 2011).*
(Continued)

*Primary Examiner* — Andrew J Golden
(74) *Attorney, Agent, or Firm* — Muncy, Geissler, Olds & Lowe, P.C.

(57) ABSTRACT

A monolithic multiple solar cell includes at least three partial cells, with a semiconductor mirror placed between two partial cells. The aim of the invention is to improve the radiation stability of said solar cell. For this purpose, the semiconductor mirror has a high degree of reflection in at least one part of a spectral absorption area of the partial cell which is arranged above the semiconductor mirror and a high degree of transmission within the spectral absorption range of the partial cell arranged below the semiconductor mirror.

15 Claims, 2 Drawing Sheets

Related U.S. Application Data continuation of application No. 14/203,669, filed on Mar. 11, 2014, now Pat. No. 9,252,313, which is a division of application No. 11/813,217, filed as application No. PCT/EP2005/014022 on Dec. 23, 2005, now Pat. No. 8,716,593.

(51) Int. Cl.

| | | |
|---|---|---|
| *H01L 31/0304* | (2006.01) | |
| *H01L 31/0687* | (2012.01) | |
| *H01L 31/056* | (2014.01) | |
| *H01L 31/052* | (2014.01) | |
| *H01L 31/047* | (2014.01) | |
| *H01L 31/054* | (2014.01) | |
| *H01L 31/0232* | (2014.01) | |
| *H01L 31/0735* | (2012.01) | |
| *H01L 31/074* | (2012.01) | |

(52) U.S. Cl.
CPC ...... *H01L 31/03046* (2013.01); *H01L 31/047* (2014.12); *H01L 31/052* (2013.01); *H01L 31/056* (2014.12); *H01L 31/0547* (2014.12); *H01L 31/0687* (2013.01); *H01L 31/074* (2013.01); *H01L 31/0735* (2013.01); *Y02E 10/52* (2013.01); *Y02E 10/544* (2013.01)

(58) Field of Classification Search
CPC ... H01L 31/0735; H01L 31/076; H01L 33/10; H01L 31/052; H01L 31/02168; H01L 31/047; H01L 31/0547; H01L 31/02327; H01L 31/074
USPC .................................................. 136/243–265
See application file for complete search history.

(56) References Cited

U.S. PATENT DOCUMENTS

| | | |
|---|---|---|
| 6,815,736 B2 | 11/2004 | Mascarenhas |
| 2001/0018924 A1 | 9/2001 | Hisamatsu et al. |
| 2002/0117675 A1* | 8/2002 | Mascarenhas .... H01L 31/06875 257/87 |
| 2003/0070707 A1* | 4/2003 | King ................. H01L 31/02168 136/255 |
| 2003/0089392 A1 | 5/2003 | Rohr et al. |
| 2004/0200523 A1 | 10/2004 | King et al. |
| 2005/0155641 A1 | 7/2005 | Fafard |
| 2005/0247339 A1 | 11/2005 | Barnham et al. |
| 2011/0011983 A1 | 1/2011 | King et al. |

OTHER PUBLICATIONS

JP 2001-308354A English machine translation (Year: 2001).*
Dimroth et al, "Next Generation GaInP/GainAs/Ge Multi-Junction Space Solar Cells" Oct. 22, 2001, Proceedings of the International Photovoltaic Solar Energy Conference, pp. 2150-2154.
Friedman et al "I-eV Solar Cells with GainNAs Active Layer" Dec. 15, 1998, Journal of Crystal Growth, pp. 409-415.
Antonio Luque et al., "Theoretical Limits of Photovoltaic Conversion", Handbook of Photovoltaic Science and Engineering, 2003 John Wiley & Sons, Ltd.
King et al., "Metamorphic III-V materials, sublattice disorder, and multijunction solar cell approaches with over 37% efficiency", Presented at the 19th European Photovoltaic Solar Energy Conference and Exhibition, vol. 7. 617104.
Dimroth et al., "5-junction III-V solar cells for space applications", Photovoltaic Energy Conversion, 2003. Proceedings of 3rd World Conference on. vol. 1. IEEE, May 11, 2003.
Meusel et al., "Spectral response measurements of monolithic GaInP/Ga(In)As/Ge triple-junction solar cells: Measurement artifacts and their explanation," Progress in Photovoltaics: Research and Applications, vol. 11, No. 8, pp. 499-514, Dec. 5, 2003.
Andreev, "Heterostructure solar cells", Semiconductor, vol. 33, No. 9, pp. 942-945, Sep. 1, 1999.
Basic parameters of AlGaAs at 300 K, http://www.ioffe.ru/SVA/NSM/Semicond/AlGaAs/basic.html, date unknown.
Basic parameters of GaAs at 300 K, http://www.ioffe.ru/SVA/NSM/Semicond/GaAs/basic.html, date unknown.
Dimroth et al, "Metamorphic $Ga_yIn_{1-y}P/Ga_{1-y}In_xAs$ Tandem Solar Cells for Space and for Terrestrial Concentrator Applications at C>1000 Suns," Progress in Photovoltaics, 2002, pp. 165-178.
Vernon et al, "Growth and Characterization of $Al_xGa_{1-x}As$ Bragg Reflectors by LP-MOCVD", Journal of Electronic Materials, 1992, vol. 21, No. 3, pp. 335-340.
Yamaguchi, "Multi-junction Solar Cells and Novel Structures for Solar Cell Applications", Physica E 2002, pp. 84-90.
Bushnell et al, "Short-circuit Current Enhancement in Bragg Stack Multi-Quantum-Well Solar Cells for Multi-Junction Space Cell Applications", Solar Energy Materials & Solar Cells, vol. 75, 2003, pp. 299-305.
Shvarts et al, "Radiation Resistant AlGaAs/GaAs Concentrator Solar Cells with internal Bragg Reflector", Solar Energy Materials & Solar Cells, vol. 68, 2001, pp. 105-122.
Bett et al, "Advanced III-V Solar Cell Structures Grown by MOVPE", Solar Energy Materials etc., pp. 541,550.
Tobin et al, "Enhanced Light Absorption in GaAs Solar Cells with Internal Bragg Reflectors", Conf Rec of $22^{nd}$ IEEE Photovoltaic Spec. Conf., 1991, pp. 147-152.
Meusel et al, "European Roadmap for the Development of III-V Multi-Junction Space Solar Cells", EP Photovoltaic Solar Energy Conf. Jun. 7-11, 2004, pp. 3581-3586.
Trupke et al, "Improved Spectral Robustness of Triple Tandem Solar Cells by Combined Series/Parallel Interconnection", Journal of Ppl. Ph./ 2004, pp. 2347-2351.
Hatcher, "Solar Cell Manufacturers Come Back Downto Earth", Compoundsemiconductor.net, 2003.
Lantratov et al, "Effect of the Increase of Radiation Resistance in Solar Cells with Internal Bragg Reflector", Proc. of Electrochem. Soc., vol. 97-21, 1997, pp. 125-132.
Dimroth et al., "3-6 junction photovoltaic cells for space and terrestrial concentrator applications," Photovoltaic Specialists Conference, pp. 525-529 (Jan. 3, 2005).
King et al., "High-Voltage, Low-Current-GaInP/GaInP/GaAs/GaInNAs/Ge Solar Cells," Photovoltaic Specialists Conference, pp. 852-855 (May 19, 2002).
Dimroth et al., "MOVPE Grown $Ga_{1-x}In_xAs$ Solar Cells for GaInP/GaInAs Tandem Applications," J. of Electron. Matt., vol. 29, No. 1, pp. 42-46 (2000).
Andreev et al., "Proton and Electron Irradiation of GaAs Solar Cells with Internal Bragg Relector," $2^{nd}$ World Conf and Exhib. on Photovoltaic Solar Energy Conversion, pp. 3757-3760 (Jul. 1998).
Andreev et al., "Ultra-Violet Sensitive Infra-Red Reflective AlGaAs/GaAs Solar Cells with Two Bragg Reflectors," $16^{th}$ Eu. Photovoltaic Solar Cell Conf & Exhib., pp. 1-3 (May 2000).
Steven Durbin, "A Computational Approach to the Analysis of Distributed Bragg Reflectors in Direct-Gap Solar Cells," IEEE 2th PVSC, pp. 69-72 (May 1996).
Andreev et al., "High-Efficiency AlGaAs—GaAs Solar Cells with Internal Bragg Reflector," IEEE 1st WCPEC, pp. 1894-1897 (Dec. 1994).
Johnson et al., "Advances in Bragg stack quantum well solar cells," IEEE Solar Energy Mater. & Solar Cells, vol. 87, pp. 169-179 (2005).
Gourley et al., "Single crystal epitaxial multilayers of AlAs GaAs, $Al_xGa_{1-x}As$ for use as optical interferometric elements," Appl. Phys. Lett., vol. 49, No. 9, pp. 489-491 (Sep. 1, 1986).
Jones et al., "Evolution of Multijunction Solar Cell Technology for Concentrating Photovoltaics," Japanese J. of App. Phys., vol. 51, pp. 1 and 10ND01-1 to 10ND01-4 (2012).

* cited by examiner

MONOLITHIC MULTIPLE SOLAR CELLS

This nonprovisional application is a continuation of U.S. application Ser. No. 14/988,250, which was filed on Jan. 5, 2016, which is a continuation of U.S. application Ser. No. 14/203,669, which was filed on Mar. 11, 2014, which is a divisional of U.S. application Ser. No. 11/813,217, which was filed on Jul. 2, 2007, which is a National Stage application of PCT/EP2005/014022, and was filed on Dec. 23, 2005, and which claims priority to German Patent Application No. DE 10 2005 000 767.8, which was filed in Germany on Jan. 4, 2005, and which are all herein incorporated by reference.

BACKGROUND OF THE INVENTION

Field of the Invention

The invention relates to a monolithic multiple solar cell made from elements of the 3rd and 5th main groups of the periodic table of elements with an integrated semiconductor mirror.

Description of the Background Art

A corresponding double solar cell (also called tandem cell) is known from the publication "Prog. Photovol: Res. Appl. 2001; 9:165-178, F. Dimroth et al. Metamorphic $Ga_yIn_{1-y}P/Ga_{1-x}In_xAs$ Tandem Solar Cells for Space and for Terrestrial Concentrator Applications at C>1000 Suns." As the integrated semiconductor mirror a Bragg mirror is used. The Bragg mirror is thus epitaxially applied on a GaAs substrate, on which in turn the double solar cell GaInP/GaInAs, which has an n to p polarity, is epitaxially applied.

From Physica E. 2002, Vol. 14, p. 84-90, M. Yamaguchi: "Multi-junction Solar Cells and Novel Structures for Solar Cell Applications", simple and multiple solar cells are known, wherein a Bragg reflector may be disposed on the rear side of the simple solar cells.

From the Journal of Electronic Materials, Vol. 21, No. 3, 1992, S. M. Vernon et al. "Growth and Characterization of $Al_xGa_{1-x}As$ Bragg reflectors by LP-MOCVD", a GaAs solar cell with a Bragg reflector on a silicon substrate is known.

From the publication "Solar Energy Materials & Solar Cells 68 (2001), p. 105-122, M. Z. Shvarts et al. "Radiation Resistant AlGaAs/GaAs Concentrator Solar Cells with Internal Bragg Reflector", a GaAs simple solar cell is known, under which a Bragg mirror is disposed. The solar cell used is a cell with a p to n polarity.

From WO-A-2004/017425, a multiple solar cell is known, in which back reflectors, which carry out the function of the electric mirrors in relation to the minority carriers, run between the individual solar cells.

Lattice-matched triple solar cells of $Ga_{0.5}In_{0.5}P/Ga_{0.99}In_{0.01}As/Ge$ are market leaders among the space solar cells. The best cells reach 30-31% efficiency under the space solar spectrum AM0. In production, so far a maximum average efficiency of at least 28.3% was achieved. A decisive factor is the radiation hardness of the cells. According to a typical irradiation with $1 \times 10^{15}$ $cm^{-2}$ 1 MeV electrons, the efficiency of these cells is degraded to 24.3%. This corresponds to a residual factor of 86%.

Quintuple to sextuple solar cells are described in "Solar Cell Manufacturers Come Back Down to Earth" by M. Hatcher, Compoundseminconductor.net magazine, November 2003.

SUMMARY OF THE INVENTION

It is an object of the invention to further develop a monolithic multiple solar cell of the kind described above in order to improve the radiation stability in such a way that the end-of-life (EOL) efficiency is increased. At the same time, current generation of the individual partial cells should not be substantially affected. The expenditure during production of the solar cell should not be noticeably influenced.

The object is attained according to the invention in that the multiple solar cell comprises at least three partial cells, the semiconductor mirror is disposed between two partial cells and has several layers with refractive indices that at least differ from each other and the semiconductor mirror has a high degree of reflection in at least one part of the absorption range of the partial cell or partial cells disposed above the semiconductor mirror and a high transmission degree for radiation in the spectral absorption range of the partial cell or partial cells disposed underneath the semiconductor mirror.

As the reflection degree R is identified herein the wavelength-dependent reflection averaged across a specific spectral range. Ideally, this spectral range comprises the entire spectral absorption range of the partial cell located over the semiconductor mirror. In the application, frequently a smaller spectral range is sufficient, in particular a reflection band close to the band gap energy of the partial cell located above it with a half-width value HWB of nm 40 mm HWB≤300 nm.

A high degree of reflection R means therein that the average reflection over the reflection band amounts to R≥0.3, preferably R≥0.7, and especially 0.7≤R≤1.

The wavelength-dependent transmission is identified herein as a degree of the transmission T averaged across the spectral absorption range of the partial cell or partial cells located under the semiconductor mirror. A high degree of transmission T means therein that T≥0.5, preferably T≥0.85, and especially 0.9≤T≤1.

An optical mirror in the form of a monolithically integrated semiconductor mirror for multiple solar cells consisting of or comprising a compound semiconductor of groups III and V of the periodic table is proposed according to the invention, wherein the multiple solar cell comprises three or more partial cells. The semiconductor mirror is installed under the nth solar cell of the multiple solar cell by means of a suitable epitaxy process. Suitable epitaxy processes are, for example, MOVPE (metal organic vapor phase epitaxy) or MBE (molecular beam epitaxy) or VPE (vapor phase epitaxy), just to name a few.

The semiconductor is made of a plurality of thin semiconductor layers with different refraction indices. The number, order, and thickness of the layers are selected in such a way that part of the solar spectrum is reflected back into the nth partial cell of the m partial solar cells, which comprises multiple solar cells. Therein, m>n as well as m=3. The thickness of the nth partial cell is cut in half by using a mirror such as this, without drastically reducing the absorption in the partial cell. At the same time, the layers are selected in such a way that the semiconductor mirror has high transmission in another part of the solar spectrum. In this way, it is ensured that the current generation in the (n+1)th partial cell, which is to say the cell that runs underneath the semiconductor mirror, as well as the other partial cells that are located underneath the semiconductor mirror, is not reduced beyond a critical degree.

The integration of a corresponding semiconductor mirror is especially advantageous if one of the partial cells of the multiple solar cell is made of a material with a low diffusion length or when the diffusion length in one of the partial cells substantially deteriorates during the application. The thickness of the nth partial cell can be cut in half by using the semiconductor mirror without strongly reducing the absorption in this partial cell. The combination of the introduction of a semiconductor mirror and a simultaneous reduction of the cell thickness has a positive effect on current generation. A more advantageous generation profile over the depth of the active layers of the partial cell is achieved. It is particularly significant that the average distance of the generated minority carriers to the depletion layer is strongly reduced due to the lesser cell thickness. This leads to an increased probability that the minority carriers will encounter the depletion layer during diffusion and will thus contribute to the current generation. The recombination is reduced in this way.

An important application example is the $Ga_{0.5}In_{0.5}P/Ga_{0.99}In_{0.01}As/Ge$ triple solar cell, which has become one of the most widely used cell in satellites in recent years. In space, the solar cells are exposed to a spectrum of highly energetic particles, for example, electrons and protons with energies in the MeV range. This radiation can lead to a degradation of the solar cell, especially to increased recombination, and therewith to a shorter diffusion length in the semiconductor material. While the GaInP upper cell and the Ge lower cell are relatively insensitive to spatial radiation, the $Ga_{0.99}In_{0.01}As$ central cell exhibits strong degradation. In typical radiation doses, such as approximately $1 \times 10^{15}$ cm$^{-2}$ 1 MeV electrons, the diffusion length in $Ga_{0.99}In_{0.01}As$ decreases so strongly that only a part of the generated minority carriers reaches the depletion layer. A strong degradation of the generated current or the quantum efficiency of the central cell is the consequence. The degradation of the central cell thus determines the degradation of the triple solar cell. This degradation can be clearly reduced by inserting the semiconductor mirror between the central and lower cells and by simultaneously cutting in half the thickness of the central cell according to the invention. The layers of the semiconductor mirror are selected in this case in such a way that high reflection within the spectral range of higher energies than those of the band gap of $Ga_{0.99}In_{0.01}As$ of approx. 1.4 eV is achieved. At the same time, sufficient transmission of lower energies must be achieved, so that sufficient current is generated in the Ge lower cell. In the case of the $Ga_{0.5}In_{0.5}P/Ga_{0.99}In_{0.01}As/Ge$ triple solar cell, the Ge lower cell generates an excess of current (approx. 30 mA/cm$^2$ in comparison with the upper partial cells with approx. 17 mA/cm$^2$), whereby the requirements of transparency of the semiconductor mirror for lower energies are not quite so high.

While in the case of the $Ga_{0.5}In_{0.5}P/Ga_{0.99}In_{0.01}As/Ge$ triple solar cell all the partial cells are bred with the same lattice constant, which is lattice-matched to the substrate, in the current development presently triple solar cells are studied, comprising lattice-mismatched layers.

Typical material combinations are GaInP/GaInAs/Ge or also AlGaInP/GaInAs/Ge, wherein the indium content in one or in both of the upper partial cells is higher than in the previously mentioned triple solar cell. The application of the semiconductor mirror according to the invention is similar for these cell concepts. The requirements of transparency of the semiconductor mirror for lower energies is somewhat higher herein than that of the energy band gap of the utilized GaInAs, since the excess of generation in the Ge lower cell is less.

The semiconductor mirror can also be similarly used for lattice-matched and lattice-mismatched quintuple solar cells, which are likewise currently under development for spatial applications. AlGaInP/GaInP/AlGaInAs/Ge is, for example, a typical material combination for such a cell.

While in the previously discussed cell concepts the problem of the low diffusion length was caused by the application in space and the radiation existing therein, there are also concepts for multiple solar cells that comprise materials with inherently lower diffusion length. $Ga_{0.5}In_{0.5}P/Ga_{0.99}In_{0.01}As/Ge$ triple solar cells can be expanded by adding a further partial cell of a material with an energy band gap of approx. 1 eV into $Ga_{0.5}In_{0.5}P/Ga_{0.99}In_{0.01}As/1$ eV material/Ge quadruple solar cells. The GaInNAs material can be used, for example, to implement an energy band gap of 1 eV with simultaneous lattice matching to the Ge substrate. However, this material has exhibited until now very low diffusion lengths, for which reason it has not been possible to achieve better results with quadruple solar cells than with triple solar cells.

The integration of a semiconductor mirror according to the invention under the GaInNAs partial cell with a simultaneous adaptation of the cell thickness can, in this case, likewise be successfully applied. The layers of the semiconductor mirror are selected therein in such a way that a high reflection of energies that are greater than 1 eV and simultaneously a high transmission of energies that are lower than 1 eV are achieved. The requirements of transparency of the semiconductor mirror for lower energies are herein very high, since the Ge lower cell does not have an excess of generation. A quadruple solar cell such as this is not only suitable for use in space, but also for applications in terrestrial concentrator systems.

Sextuple solar cells for spatial applications are also known. These are obtained, for example, from the expansion of an AlGaInP/GaInP/AlGaInAs/GaInAs/Ge quintuple solar cell with a further partial cell of a material with an energy band gap of approx. 1.0-1.1 eV. A possible material combination is thus AlGaInP/GaInP/AlGaInAs/GaInAs/GaInNAs/Ge. The integration of one or even two semiconductor mirrors is carried out according to the teaching of the invention.

Examples of multiple solar cells can also be found in the publication "Proceedings of the 19th European Photovoltaic Energy Conference", 7-11 Jun. 2004, Paris, p. 3581-3586, M. Muesel et al: "European Roadmap for the Development of III-V Multi-Junction Space Solar Cells."

If, as is customary for the epitaxy of a multiple solar cell structure, a Ge substrate is used, which is activated during the epitaxy and forms the Ge lower cell, the teaching of the invention can also be applied to solar cells in which the epitaxy is carried out on a silicon or Si/Ge substrate.

Independently from this, a further development of the invention provides that the layer of the semiconductor mirror that precedes the subsequent partial cell has a lattice structure, which is adapted to that of the partial cell.

The layers of the semiconductor mirror are made of a compound semiconductor of the 3rd and 5th main groups of the periodic table or comprise these. The compound semiconductors can be doped herein with Si, Te, Zn, C, Mg and/or Se.

The layers can be made of a compound semiconductor material, such as AlGaInAs material and/or AlGaInP material or can comprise these, wherein AlGaInAs includes GaAs, InAs, AlAs, GaInAs, AlGaAs, AlInAs and/or AlGaInP includes GaP, InP, AlP, GaInP or AlInP.

The respective layer of the semiconductor mirror should have a thickness d with 2 nm≤d≤300 nm, especially 10 nm≤d≤150 nm.

The semiconductor mirror comprises n layers, wherein 10≤n≤50, especially 15≤n≤35. The total thickness D of the semiconductor mirror should amount to 500 nm≤D≤4000 nm, especially 750 nm≤D≤2500 nm.

The invention teaches very generally that, with n layers of the semiconductor mirror, at least two layers have different refraction indices and/or at least two layers have different material compositions and/or at least two layers have different thicknesses. Three or more layers can, of course, also have different material compositions or different indices of refraction or different thicknesses.

Due to the plurality of different material layers, especially advantageous properties are achieved with reference to the reflection and transmission, as well as the possibility of passivation of the boundary layer to the partial cell located above it.

The invention provides especially that the semiconductor mirror is integrated between the central and lower cells of a GaInP/GaInAs/Ge triple solar cell, wherein preferably the GaInAs central cell has a thickness of $d_m$ with 500≤$d_m$≤2500 nm, and especially 800 nm≤$d_m$≤2000 nm.

The invention provides furthermore that one or more semiconductor mirrors are integrated in a GaInP/GaInAs/GaInNAs/Ge quadruple solar cell, wherein a semiconductor mirror is disposed especially between the GaInNAs and the Ge partial cells.

An integration of the semiconductor mirror is also possible in a quintuple solar cell, which is made, for example, of the partial cells AlGaInP/GaInP/AlGaInAs/GaInAs/Ge, wherein the semiconductor mirror should be disposed between the GaInAs and the Ge partial cells.

In the event that a sextuple solar cell is used, in which one or more semiconductor mirrors are integrated, the solar cell should comprise the partial cells AlGaInP/GaInP/AlGaInAs/GaInAs/GaInNAs/Ge.

Particularly good EOL efficiency can be produced when the semiconductor mirror has a high half-width value. An optimal half-width value (HWB) would be the one that includes the entire absorption range of the partial cell located above it. In this way, however, limitations of the degree of reflection would have to be tolerated or a high material consumption would be required. In order to achieve optimization, the half-width value should be between 50 nm and 300 nm, especially between 80 nm and 150 nm.

The layers of the semiconductor mirror should also be designed in such a way that the degree of reflection R amounts to R≥0.3, especially R≥0.7, and preferably to 0.7≤R≤1 and the degree of transmission T amounts to T≥0.5, especially T≥0.85, and preferably 0.9≤T≤1.

A special case of the semiconductor mirror according to the invention is the Bragg reflector. The latter consists usually of a periodic overlay lattice made of 2 materials with different indices of diffraction. The thickness of the respective layers of material is constant. In this way, reflections up to almost 100% can be achieved, depending on the number of overlay lattice periods. The Bragg mirrors are used, for example, in surface emitting lasers.

The semiconductor mirror according to the invention, which has the function of an optical mirror, represents very generally an extremely good reflector with reference to the partial cells disposed above it and a long pass filter with reference to the partial cell disposed underneath the semiconductor mirror.

The teaching of the invention can be advantageously used especially if one of the partial cells is a multiple solar cell made from a material with a low diffusion length or if the diffusion length considerably deteriorates during use in one of the partial cells. The thickness of the nth partial cell can be cut in half by using the semiconductor mirror without substantially reducing the absorption in the partial cell. The combination of the integration of a semiconductor mirror and the simultaneous reduction of the cell thickness has a positive effect on current generation. On the one hand, a more favorable regeneration profile is achieved over the depth of the active layers of the partial cell and, on the other hand, the lesser cell thickness causes a strong reduction of the average distance of the generated minority carriers to the depletion layer. This leads to an increased probability that the minority carriers will encounter the depletion layer during the diffusion and will thus contribute to current generation. The recombination is consequently reduced. As a consequence of this, an increase of the current generated in the partial cell is achieved, which is limited by a low diffusion length based on the teaching of the invention. Especially the radiation stability of the $Ga_{0.99}In_{0.01}As$ central cell of a $Ga_{0.5}In_{0.5}P/Ga_{0.99}In_{0.01}As/Ge$ triple solar cell can be clearly improved.

The overall thickness of the multiple solar cell can be further reduced by means of the integration of a semiconductor mirror. Corresponding improvements of the radiation stability result in the case of the $Ga_{0.99}In_{0.01}As$ or lattice-mismatched GaInAs partial cells in multiple solar cells with three or more partial cells. Through the integration of a semiconductor mirror, the teaching of the invention can provide a decisive contribution to the successful application of new materials with low diffusion lengths, such as GaInNAs as partial cell in a multiple solar cell.

The semiconductor mirror is characterized by suitable materials, wherein a lattice match with the partial cells disposed on the semiconductor mirror is carried out. At least two materials with a high difference in the indices of refraction are used in order to achieve high reflection. Materials with an equally great or greater band gap than that of the partial cell located above it are used in order to prevent the occurrence of an absorption for smaller energies. The thickness of the partial cell applied on the semiconductor mirror can be reduced, especially cut in half, by means of the integration of the semiconductor mirror.

In order to configure the semiconductor mirror, conventional epitaxy processes are used, which allow the deposition of numerous layers of different materials. As an example should be mentioned MOVPE, MBE, VPE, and the like. The semiconductor mirror is also deposited during the epitaxy of the solar cell structure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
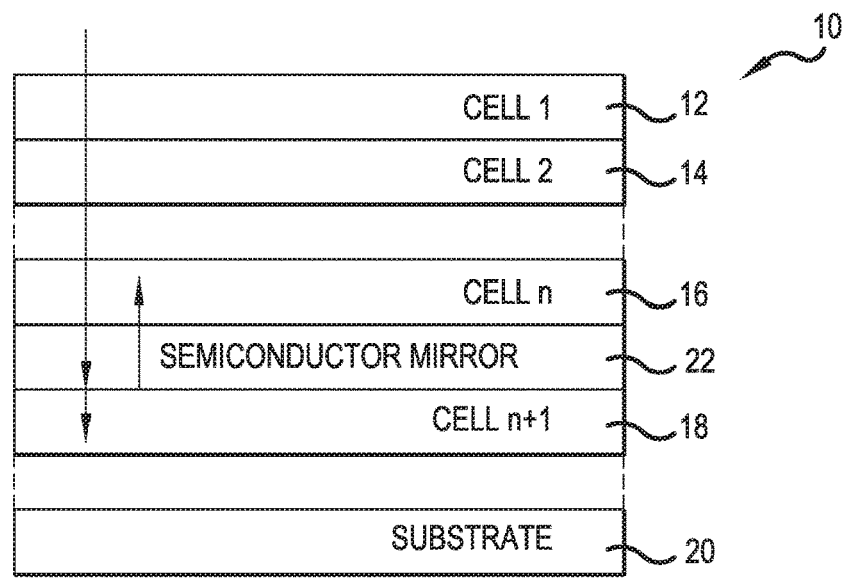
FIG. 1 shows a schematic configuration of a multiple solar cell with integrated semiconductor mirror.

The schematic configuration of a multiple solar cell 10 with a semiconductor mirror integrated according to the invention can be seen in FIG. 1. The solar cell 10 comprises m partial cells 12, 14, 16, 18, which have been epitaxially applied on a substrate 20. Between the (n)th cell 16 with m>n and the (n+1)th cell 18, a semiconductor mirror 22 is integrated, which has also been deposited during the epitaxy of the solar cell structure. Suitable epitaxy processes to be considered are those that are suitable for the deposition of numerous layers of different materials. MOVPE, MBE (molecular beam epitaxy), or VPE (vapor phase epitaxy) can be mentioned as examples, without causing as a consequence a limitation of the teaching of the invention.

The multiple solar cell 10 is especially a triple solar cell, wherein the upper cell is made of $Ga_{0.5}In_{0.5}P$, the central cell is made of $Ga_{0.99}In_{0.01}As$, and the lower cell is made of Ge. The semiconductor mirror 22, which comprises several layers, is integrated in particular between the lower cell made of Ge and the central cell made of $Ga_{0.99}In_{0.01}As$. The layered structure is such that at least two layers of different materials, different thicknesses, and different indices of refraction are provided.

Figure 2:
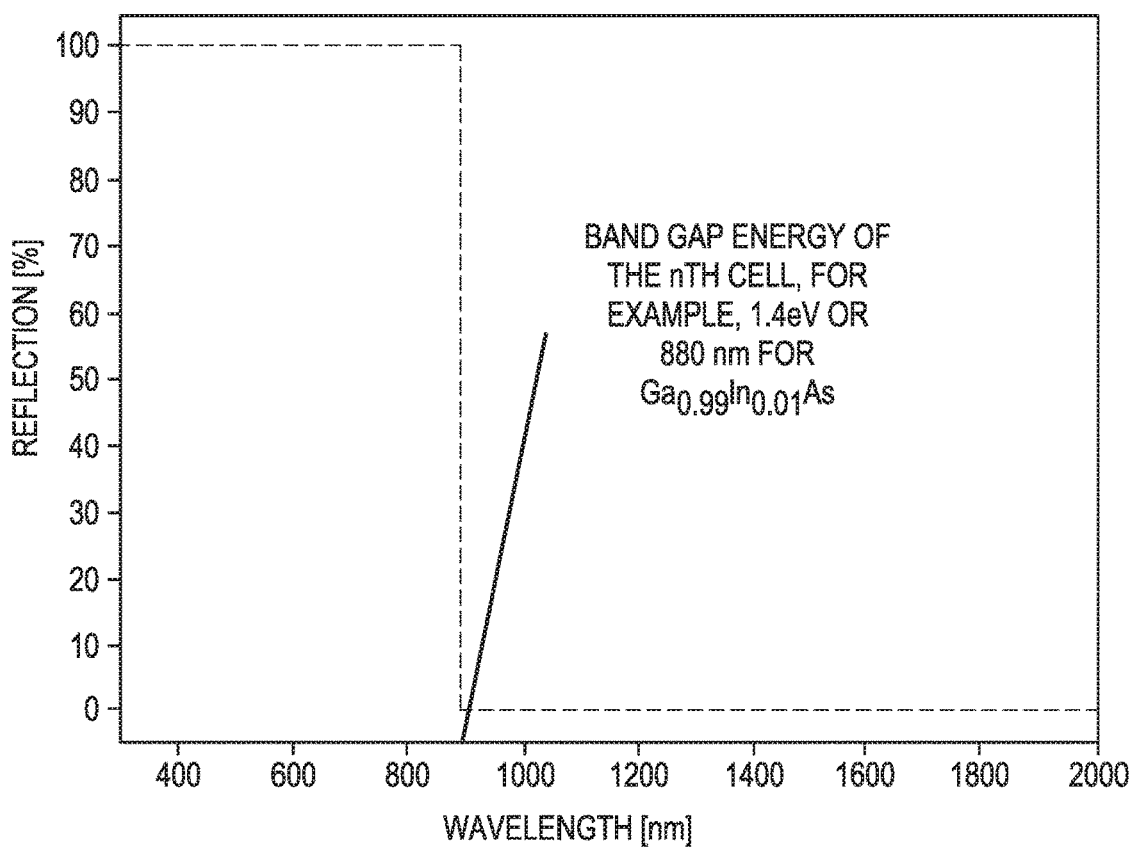
FIG. 2 shows a reflection of an ideal semiconductor mirror.

Through the selection of the materials, layer thicknesses, and indices of refraction, in the ideal case a reflection behavior as that shown in FIG. 2 is achieved. Maximum reflection is thus obtained for energies greater than the band gap energy of the nth partial cell, that is, maximum reflection is achieved in the exemplary embodiment of the triple cell with a $Ga_{0.99}In_{0.01}As$ central cell having a band gap energy of >1.4 eV or 880 nm. For energies that are lower than the band gap energy of the nth cell, the reflection is minimal or the transmission is maximal. Transmission losses through absorption in the semiconductor mirror can be prevented or kept negligibly small by selecting suitable materials, for example, GaAs and AlGaAs.

The uppermost layer of the semiconductor mirror 22 can be made of GaInP and at the same time be the rear side field for the $Ga_{0.99}In_{0.01}As$ central cell located above. GaInP is used as material, since it has very good properties as rear side passivation. The remaining layers of the semiconductor mirror 22 in the exemplary embodiment are made of three different materials: $Ga_{0.99}In_{0.01}As$, $Al_{0.2}Ga_{0.8}As$, and $Al_{0.8}Ga_{0.2}As$. There is an essential difference with respect to the Bragg reflector, which is made of only two different materials. Furthermore, various layer thicknesses are also in the example, while in the classic Bragg reflector all the layers of one material have the same thickness.

Figure 3:
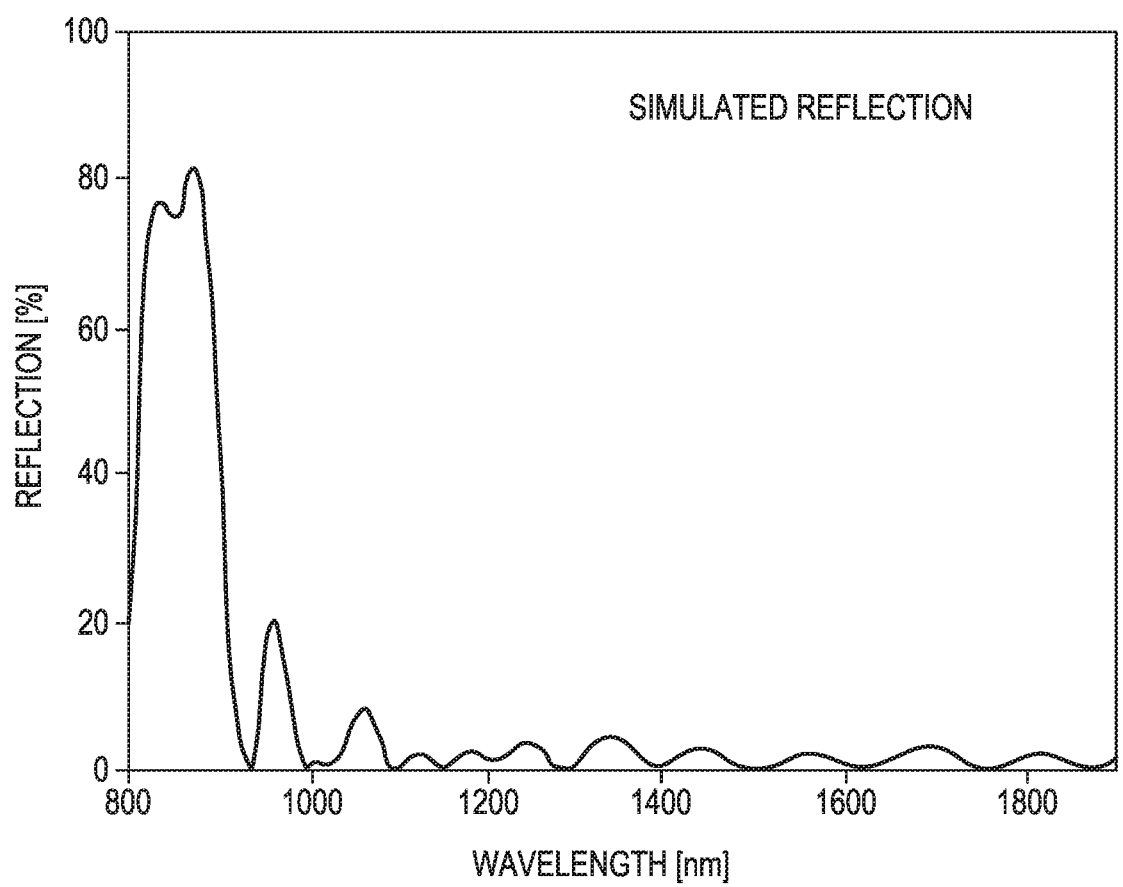
FIG. 3 shows a simulated reflection of a semiconductor mirror.

A further essential characteristic of the layer sequence of the semiconductor mirror 22 is that it reaches, on the one hand, a high reflection for energies above the band edge of the partial cell located above it, but has, on the other hand, also a low reflection or high transmission for lower energies. The reflection of the semiconductor mirror on the boundary surface to the $Ga_{0.99}In_{0.01}As$ partial cell disposed above is shown in FIG. 3 to illustrate this. A high reflection is achieved for wavelengths between 800 nm and 900 nm. For wavelengths greater than 900 nm, however, the reflection is low. This is an important property of the semiconductor mirror, which ensures that the current generation in the Ge lower cell is not substantially reduced by the semiconductor mirror 22.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell formed of III-V semiconductor materials, comprising:
    a first cell formed of a plurality of first layers, the first cell having a first band gap energy for individual current generation by the first cell, and at least two of the first layers have a different doping from one another;
    a second cell formed of a plurality of second layers, the second cell having a second band gap energy for individual current generation by the second cell, and at least two of the second layers have a different doping from one another,
    a tunnel diode, the first cell and the second cell being connected in series by the tunnel diode;
    a third cell formed of a plurality of third layers, the third cell individually generating current, and at least two of the third layers have a different doping from one another; and
    a Bragg reflector formed of a plurality of fourth layers, the fourth layers partially reflecting incident light back to the first cell and allowing a portion of the incident light to pass to the third cell, the Bragg reflector being arranged between and adjacent to the second cell and the third cell.

2. The solar cell according to claim 1, wherein the solar cell is a monolithic solar cell.

3. The solar cell according to claim 1, wherein the plurality of fourth layers contain at least 10 layers.

4. The solar cell according to claim 1, wherein the plurality of fourth layers have at least two layers that have a different thickness or a different refraction index or are made of different materials.

5. The solar cell according to claim 1, wherein the Bragg reflector has materials with a band gap energy that is equal with or greater than the first cell and the second cell.

6. The solar cell according to claim 1, wherein the solar cell is a single solar cell stack.

7. The solar cell according to claim 1, wherein no additional cell is formed between the first cell, second cell, and the Bragg reflector.

8. The solar cell according to claim 1, wherein at least a portion of light passes through the first cell and the second cell, then the Bragg reflector, and then to the third cell.

9. The solar cell according to claim 1, wherein the at least two of the first layers of the first cell are lattice-mismatched, and wherein the at least two of the second layers of the second cell are lattice-mismatched.

10. The solar cell according to claim 1, further comprising:
a substrate disposed adjacent to the third cell, wherein the first cell has a first surface facing outward, and wherein the first cell has a second surface facing the substrate.

11. The solar cell according to claim 10, wherein the partially reflected light travels back towards the first cell at least partially through the second cell.

12. The solar cell according to claim 1, wherein the second band gap energy is equal to or less than the first band gap energy.

13. A solar cell formed of III-V semiconductor materials, comprising:
a first cell formed of a plurality of first layers, at least two of the first layers being doped and having a different doping from one another;
a second cell formed of a plurality of second layers, at least two of the second layers being doped and having a different doping from one another;
a third cell formed of a plurality of third layers, at least two of the third layers being doped and having a different doping from one another; and
a Bragg reflector formed of a plurality of fourth layers, the fourth layers partially reflecting incident light back to the first cell and allowing a portion of the incident light to pass to the third cell, the Bragg reflector being arranged between and adjacent to the second cell and the third cell.

14. The solar cell according to claim 13, wherein each of the first cell, the second cell, and the third cell individually generate current.

15. The solar cell according to claim 13, further comprising:
a tunnel diode, the first cell and the second cell being connected in series by the tunnel diode, the Bragg reflector being directly adjacent to the second cell or the third cell.

* * * * *